United States Patent [19]
Law

[11] Patent Number: 5,711,009
[45] Date of Patent: Jan. 20, 1998

[54] METHOD AND APPARATUS FOR MINIMIZING THE EFFECTS OF FREQUENCY SELECTIVE FADING ON A PCM/FM DATA SIGNAL

[75] Inventor: Eugene Lloyd Law, Ventura, Calif.

[73] Assignee: The United States of America as Represented by the Secretary of The Navy, Washington, D.C.

[21] Appl. No.: 617,726

[22] Filed: Apr. 1, 1996

[51] Int. Cl.⁶ .................. H04B 7/02; H07B 15/00
[52] U.S. Cl. .................. 455/504; 455/314; 455/65; 244/3.14
[58] Field of Search .................. 340/825.51, 825.61, 340/870.01; 455/52.1, 52.3, 65, 314, 142, 180.1, 188.1, 295, 303, 305, 306; 375/285, 267, 346, 347; 244/3.14

[56] References Cited

U.S. PATENT DOCUMENTS

| | | | |
|---|---|---|---|
| H1288 | 2/1994 | Lusk | 340/870.7 |
| 3,176,231 | 3/1965 | Vallese et al. | 325/476 |
| 3,745,464 | 7/1973 | Lee | 325/62 |
| 3,869,673 | 3/1975 | Close | 325/363 |
| 4,003,006 | 1/1977 | Mandeville et al. | 333/16 |
| 4,088,955 | 5/1978 | Baghdady | 325/56 |
| 4,326,294 | 4/1982 | Okamoto et al. | 455/139 |
| 4,430,744 | 2/1984 | Johnson | 375/14 |
| 4,499,606 | 2/1985 | Rambo | 455/277 |
| 4,566,133 | 1/1986 | Rambo | 455/277 |
| 4,710,975 | 12/1987 | Okamoto et al. | 455/276 |
| 5,010,584 | 4/1991 | Seki | 455/83 |
| 5,241,544 | 8/1993 | Jasper et al. | 370/105.3 |
| 5,483,694 | 1/1996 | Bartels et al. | 455/295 |

*Primary Examiner*—Edward F. Urban
*Assistant Examiner*—Darnell R. Armstrong
*Attorney, Agent, or Firm*—Melvin J. Sliwka; David S. Kalmbaugh

[57] ABSTRACT

An apparatus for the error free transmission of PCM/FM telemetry data. The apparatus comprises a first mixer for receiving an RF signal which has a first frequency and which is the carrier for the PCM/FM telemetry data. A variable frequency oscillator provides a local oscillator signal to the first mixer which is an offset for the RF signal. The first mixer then mixes the RF signal with the local oscillator signal resulting in the RF signal having a second frequency. This RF signal is supplied to a second mixer which mixes the RF signal with a fixed frequency signal provided by a fixed frequency oscillator. The RF signal provided by the second mixer now has a third frequency and is supplied to a bandpass filter. The frequency of the local oscillator signal is adjusted so that the offset to the RF signal provided by the first mixer is approximately one half of the intermediate frequency bandwidth of the bandpass filter. An analog signal is provided by the bandpass filter with the bandpass filter attenuating the signal in one state resulting in a substantial difference between the amplitude of the signal in the one state and its amplitude in another state. The analog signal is next supplied to an AM detector. The AM detector then provides at its output a PCM telemetry data signal which has voltage spikes removed from the PCM telemetry data signal.

16 Claims, 3 Drawing Sheets

METHOD AND APPARATUS FOR MINIMIZING THE EFFECTS OF FREQUENCY SELECTIVE FADING ON A PCM/FM DATA SIGNAL

BACKGROUND OF THE INVENTION

1. Field of the Invention

The present invention relates generally to the transmission of telemetry data from a missile's telemetry unit to a receiver prior to flight. In particular, the present invention relates to an offset amplitude modulation (AM) demodulator for correcting the effects of frequency selective fading during the transmission of telemetry data from the missile's telemetry unit to a receiver while the missile is in a launch canister.

2. Description of the Prior Art

Prior, to the launch of a missile from its launch canister pulse code modulated (PCM) telemetry data which frequency modulates (FM) an radio frequency (RF) carrier is transmitted from a missile's telemetry unit to a receiver which is coupled to a receiving station providing the receiving station with useful and often critical information regarding the missile's performance and operating characteristics prior to the missile's launch from its launch canister.

Under ideal conditions transmission of PCM/FM telemetry data prior to launch is from the missile's telemetry unit directly to the receiver via one path within the missile's launch canister. However, as shown in FIG. 1, transmission of PCM/FM telemetry data prior to launch normally occurs over multiple paths. There is generally a direct data transmission path (illustrated by reference numeral 24 of FIG. 1) and one or more indirect data transmission paths (illustrated by reference numerals 44 and 34 of FIG. 1) from the missile's transmitting antenna to a receiving antenna. Multipath transmission of PCM/FM telemetry data within a missile's launch canister prior to launch causes a phenomenon known as "frequency selective fading". Frequency selective fading results in a distortion in the received waveform including unwanted spikes and noise as shown in the receiver output waveform of FIG. 2. This, in turn, leads to pre-launch PCM/FM telemetry data which may be un-intelligible and therefore of little or no use to personnel at the receiving station and may result in a cancellation of the launch of a missile.

Thus, there is a need to eliminate from PCM/FM telemetry data unwanted spikes and noise caused by frequency selective fading due to multipath transmission of the data in the missile's launch canister prior to launch of the missile.

It is therefore an object of the present invention to provide a relatively simple yet highly effective demodulator which acts to minimize the distortion introduced by multipath transmission of PCM/FM telemetry data in a missile's launch canister prior to launch of the missile.

It is another object of the present invention to provide pre-launch PCM/FM telemetry data which is accurate and therefore very useful to personnel at a receiving station in analyzing the performance of a missile prior to launch.

It is yet another object of the present invention to provide a offset AM demodulator which provides for the error free transmission of pre-launch PCM/FM telemetry data, thereby allowing for the successful launch of a missile from its launch canister.

Various other objects, advantages and novel features of the present invention will become apparent to those skilled in the art as a more detailed description of the invention is set forth below.

SUMMARY OF THE INVENTION

The present invention overcomes some of the disadvantages of the prior art, including those mentioned above, in that it comprises a relatively simple and highly efficient method and apparatus which provides for the error free transmission of pre-launch Pulse Code Modulated/Frequency Modulated (PCM/FM) telemetry data to a receiver, thereby allowing for the successful launch of a missile from its launch canister. Included in the receiver is a first mixer for receiving an RF (radio frequency) signal which has a first frequency and which is the carrier for the PCM/FM telemetry data. A variable frequency oscillator provides a local oscillator signal to the first mixer which is an offset for the RF signal. The first mixer then mixes the RF signal with the local oscillator signal from the variable frequency oscillator resulting in the RF signal which is provided at the output of the first mixer having a second frequency.

This RF signal is then supplied to a second mixer which mixes the RF signal with a fixed frequency signal supplied to the second mixer by a fixed frequency oscillator. The RF signal occurring at the output of the second mixer now has a third frequency and is supplied to the input of a bandpass filter.

The frequency of the local oscillator signal is adjusted so that the offset to the RF signal provided at the output of the first mixer is approximately one half of the intermediate frequency bandwidth of the bandpass filter.

An analog signal is provided at the output of the bandpass filter with the bandpass filter attenuating the signal in one state resulting in a substantial difference between the amplitude of the signal in the one state and its amplitude in another state.

The analog signal occurring at the output of bandpass filter is supplied to the input of an AM (amplitude modulation) detector. The AM detector then provides at its output a PCM telemetry data signal which has voltage spikes removed from the PCM telemetry data signal.

DETAILED DESCRIPTION OF THE PREFERRED EMBODIMENT

Figure 1:
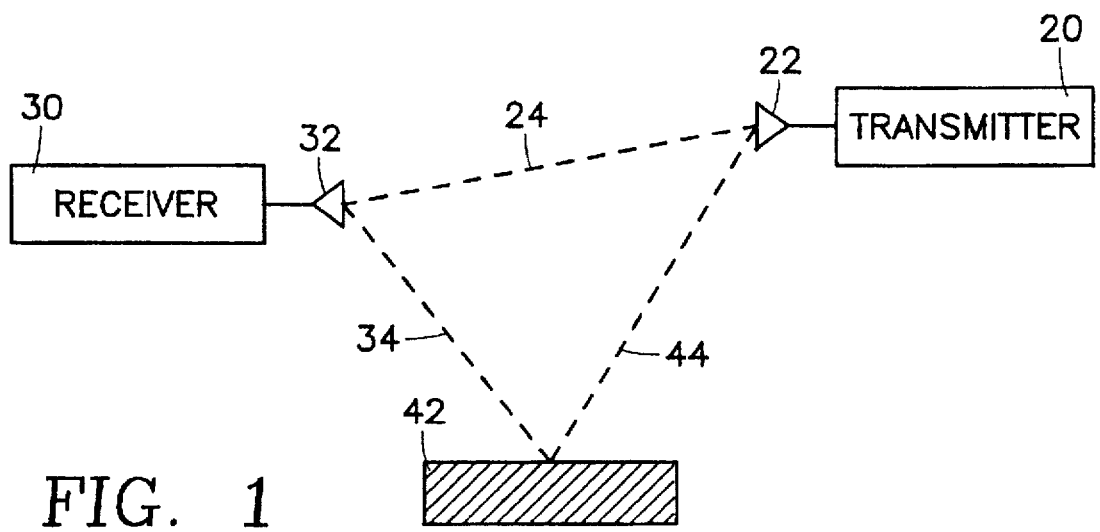
FIG. 1 illustrates the multipath transmission of a missile's PCM/FM telemetry data in launch canister prior to launch of the missile.
Figure 2:
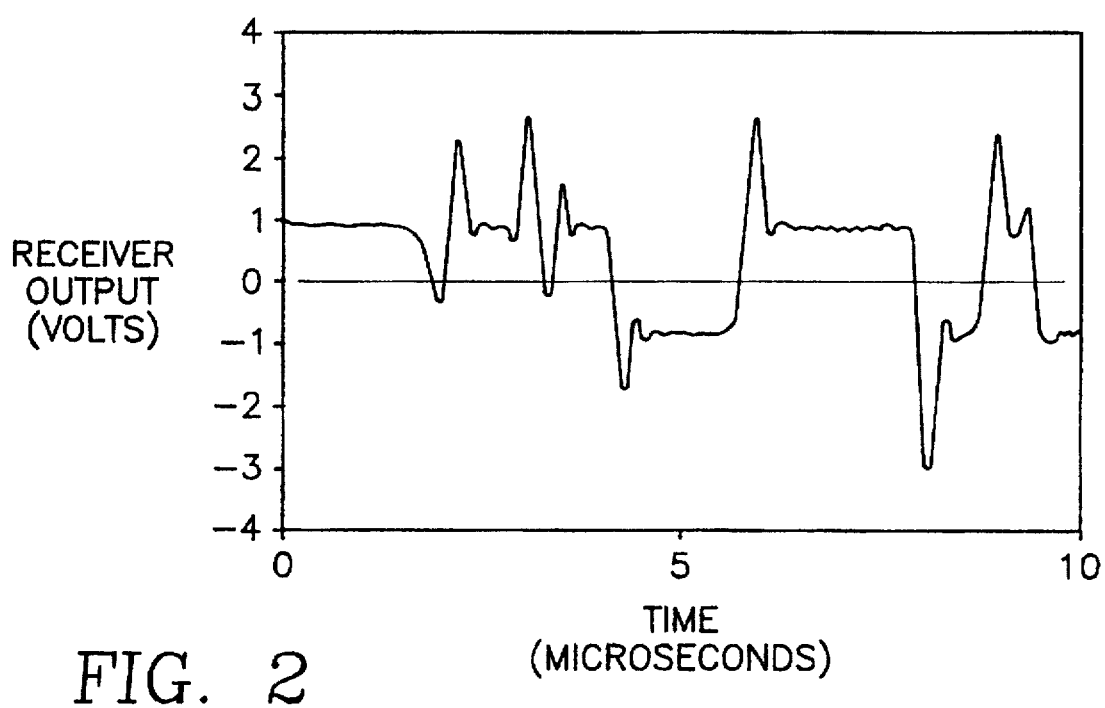
FIG. 2 illustrates the distortion caused by frequency selective fading of the output waveform provided by an FM demodulator within a telemetry receiver.
Figure 3:
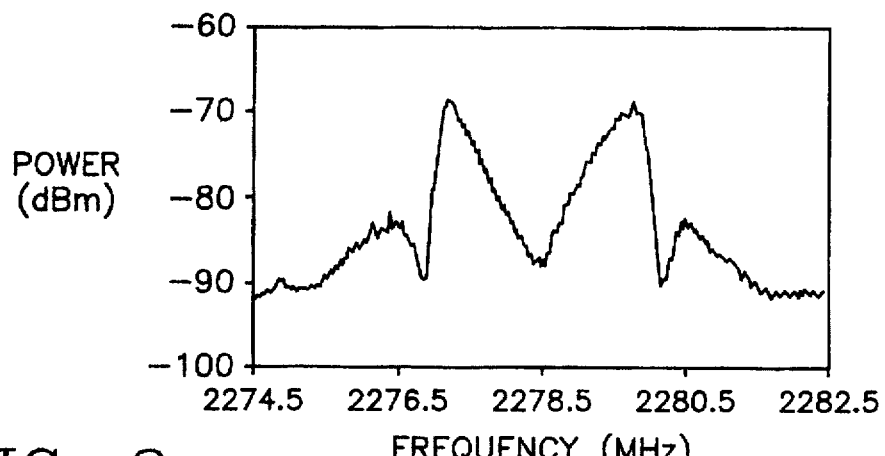
FIG. 3 illustrates a radio frequency spectrum diagram with frequency selective fading caused by multipath transmission of PCM/FM telemetry data within a missile's launch canister.

Referring first to FIGS. 1, 2 and 3, FIG. 1 illustrates the multipath environment for the transmission of pulse code modulated (PCM) telemetry data which frequency modulates (FM) an RF (radio frequency) carrier prior to launch of the missile from the missile's launch canister (designated by the reference numeral 42). It should be noted the carrier frequency band utilized for the transmission of the missile's PCM telemetry data is from about 2200 MHz to about 2290 MHz.

Prior to launch of a missile, the digital telemetry data from the missile's telemetry unit is supplied to a transmitter 20 on board the missile and then transmitted as PCM/FM telemetry data via a missile transmitting antenna 22 along a direct path 24 to a receiving antenna 32 which is located inside of the missile launch canister 42. The receiving antenna 32 is connected to a telemetry receiver 30 located at a receiving station.

This PCM/FM telemetry data is also transmitted along multiple indirect paths such as the indirect path 44 of FIG. 1 from antenna 22 to the inner wall of launch canister 42. The telemetry data is next reflected from the inner wall of the launch canister 42 along indirect path 34 to receiving antenna 32 which then supplies the multipath PCM/FM telemetry data to receiver 30 for decoding into a digital format.

Referring to FIGS. 1 and 3 in a multipath environment, the effects of frequency selective fading on an RF (Radio Frequency) signal were simulated by splitting the RF signal into two paths, one path being a shorter direct path similar to path 24 in FIG. 1 and the other path being a longer indirect path similar to paths 34 and 44 in FIG. 1. The RF signal utilized during the simulation was frequency modulation by a 2.4 megabits per second non-return-to-zero (NRZ) PCM waveform. There was a built-in delay of approximately 9 nanoseconds between the RF signal transmitted via the direct path which in FIG. 1 is path 24 and the RF signal transmitted via the indirect path which in FIG. 1 comprises paths 34 and 44.

Referring to FIG. 3, the carrier frequency and the gains of the two RF signals traveling the direct path and indirect path were adjusted until a null occurred in the signal passband at a frequency of 2278.5 MHz and the attenuation change across the passband was approximately 20 dB. A spectrum analyzer was then utilized to measure frequency selective fading induced by the multipath transmission of the RF signal with the RF spectrum for the received RF signal being illustrated in FIG. 3. This signal was next supplied to an FM demodulator within a telemetry receiver with the output waveform for the FM demodulator including undesirable spikes and noise as depicted in FIG. 2. The output waveform (FIG. 2) from the FM demodulator was then supplied to a PCM bit synchronizer and a bit error detector with the bit error detector being unable to achieve synchronization with the signal of FIG. 2.

Figure 4:
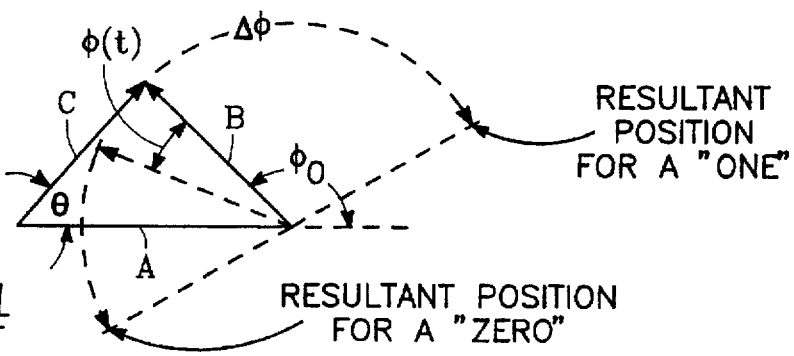
FIG. 4 is a vector diagram depicting the effects of multipath transmission prior to launch of a missile from its launch canister.

Referring now to FIG. 4 there is shown a vector diagram depicting the effects of multipath transmission on an RF signal. For purposes of illustration it is assumed that a binary one will deviate the carrier to a higher frequency and a binary zero will deviate the carrier to a lower frequency. The vector identified by the character A represents the magnitude of the direct signal, the vector identified by the character B represent the magnitude of the indirect signal, and the vector identified by the character C represent the magnitude of the resultant vector. The phase difference $\phi_0$ between the vector A and the vector B is equal to the product of the frequency of the RF signal and the time delay between the direct signal and the indirect signal. Therefore, a frequency of 2278.5 MHz and a delay of 9 nanoseconds produces a phase shift of 20.5 cycles. As depicted in FIG. 4 the B vector moves to a first position which represents the signal at a frequency of a "zero" and then moves to a second position which represents the signal at the frequency of a "one". The signal moves between these two positions on every bit transition from a "zero" to a "one" and on every bit transition from a "one" to a "zero". The phase swing of B relative to A is equal to the product of the delay and the frequency change which is a peak-to-peak frequency deviation. For example, if the peak-to-peak deviation is 2 MHz the phase swing would be approximately 0.0183 cycles or 6.6 degrees. The minimum amplitude of the resultant vector occurs when the A vector and the B vector are 180 degrees out-of-phase.

Figure 6:
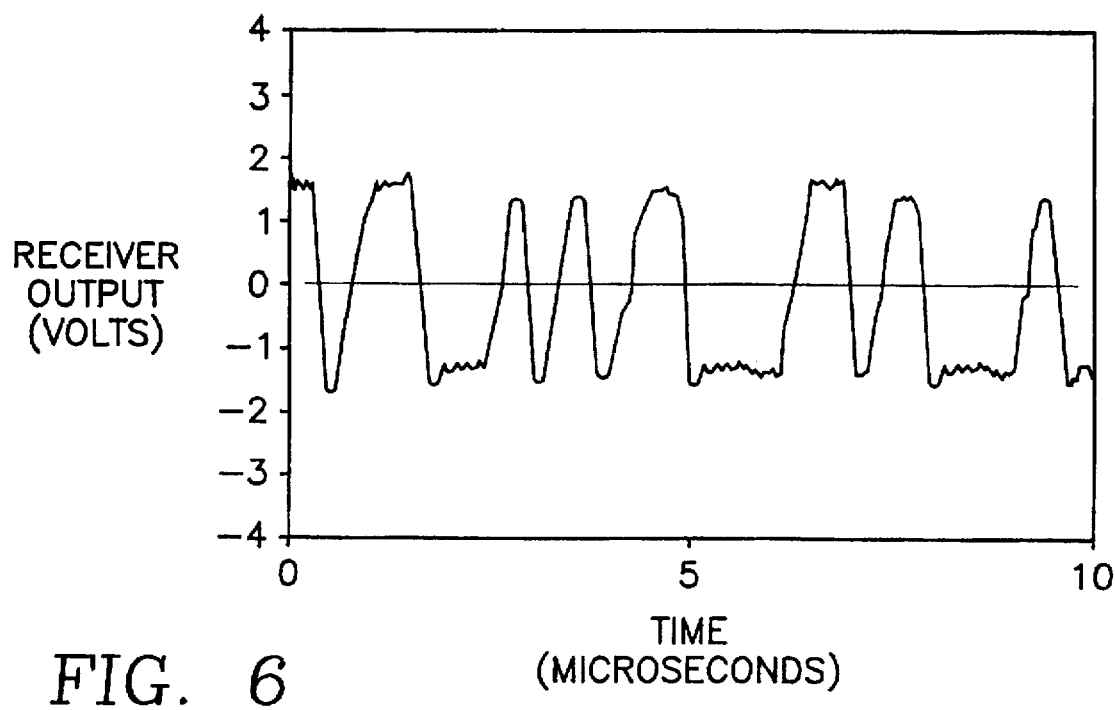
FIG. 6 illustrates the output waveform provided by the AM demodulator of FIG. 5 which has distortion caused by frequency selective fading minimized in the waveform.
Figure 7:
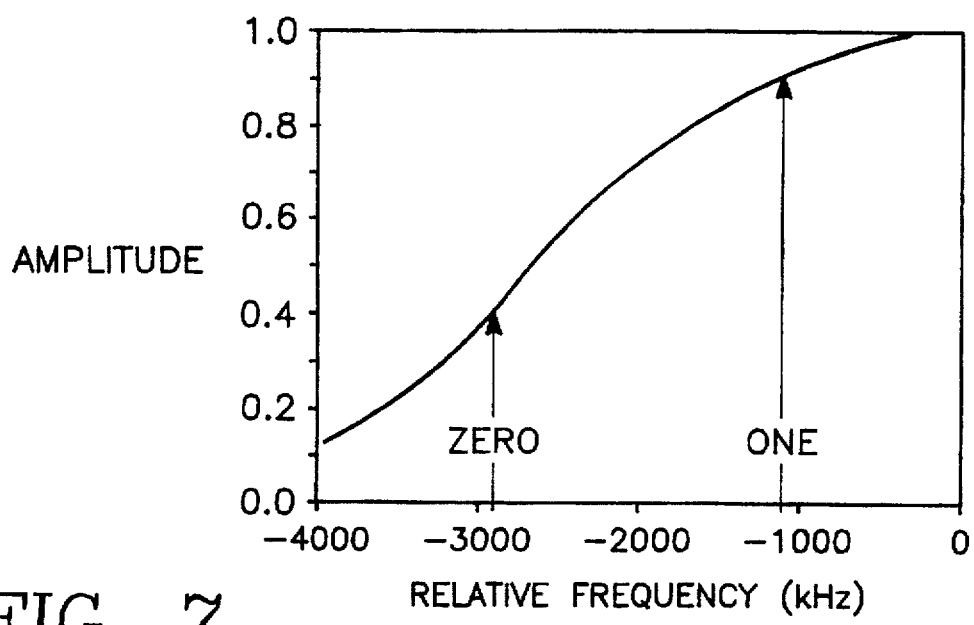
FIG. 7 illustrates the output waveform provided by the Intermediate Frequency filter of FIG. 5.

The multipath distortion component appearing at the output of an FM demodulator is proportional to the time rate of change of the phase angle θ. The equation for calculating the term dθ/dt caused by the multipath environment for the vector diagram of FIG. 6 is as follows:

$$\frac{d\theta}{dt} = \frac{B(B + A\cos[\phi_0 + \phi(t)])\frac{d\phi}{dt}}{A^2 + B^2 + 2AB\cos[\phi_0 + \phi(t)]} \quad (1)$$

Examination of equation (1) shows that the denominator is minimum when $[\phi_0+\phi(t)]=180$ degrees, therefore distortion is maximum. This occurs when the A and B vectors are antiparallel. The distortion component is also influenced by the relative magnitudes of the A and B vectors and becomes greater as the magnitudes of vectors A and B become nearly equal.

Other factors influencing both the occurrence and the amplitude of multipath distortion included the position of the average phase angle $\phi_0$ and a time delay τ which the modulation swing Δφ in accordance with the following equation:

$$\Delta\phi = 2\Delta\omega_m \tau \quad (2)$$

where $\Delta\omega_m$=peak angular deviation of the transmitter.

Figure 5:
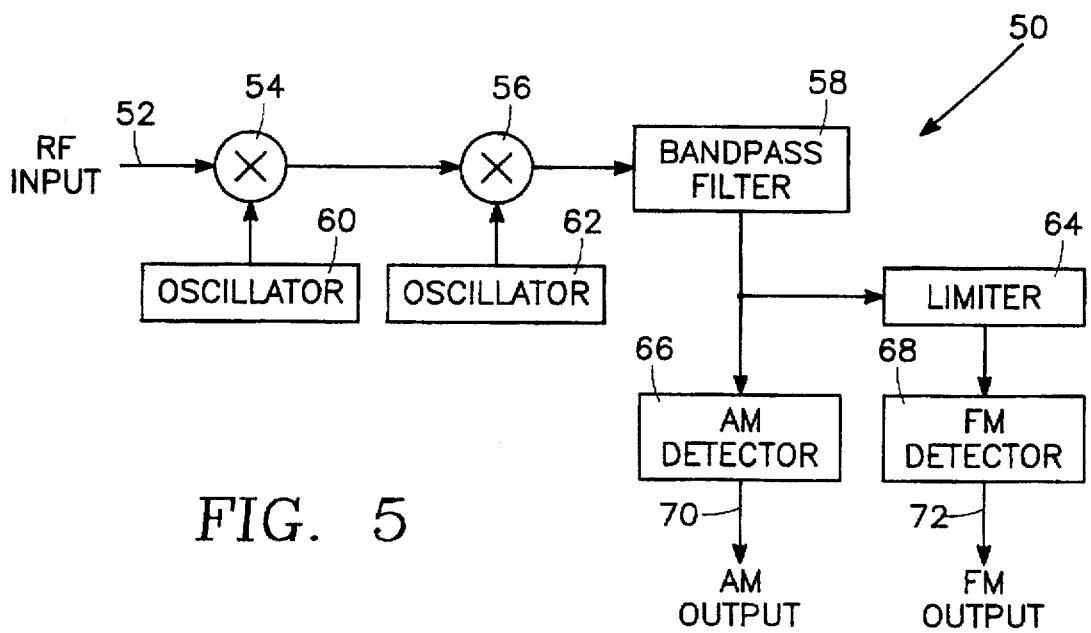
FIG. 5 illustrates an AM demodulator for minimizing distortion introduced by multipath transmission of PCM/FM telemetry data within a missile's launch canister.

Referring now to FIGS. 1 and 5, prior to launch of a missile PCM/FM telemetry data is transmitted by the missile's on board antenna 22 along direct path 24 and indirect path 44 and its associated reflection path 34 to the missile canister receiving antenna 32. The receiving antenna then supplies the PCM/FM telemetry data to telemetry receiver 30. As shown FIG. 5, the telemetry receiver 30 (FIG. 1) includes electrical components which comprise an offset (AM) amplitude modulation demodulator (designated by the reference numeral 50) for minimizing the distortion introduced by multipath transmission of PCM/FM telemetry data in the missile's launch canister 42 prior to launch of the missile.

The PCM/FM telemetry data is supplied to the RF input of demodulator 50. The RF input is connected via an input line 52 to a mixer 54 allowing mixer 54 to receive the PCM/FM telemetry data. There is also connected to mixer 54 a variable frequency oscillator 60 which provides a local oscillator signal to mixer 54.

The RF (radio frequency) input signal which is supplied to mixer 54 and which is the carrier for the PCM/FM telemetry data has a frequency of about 2278.5 MHz. For a telemetry data stream of 2.4 megabits per second with a 4 MHz bandwidth intermediate frequency (IF) filter the desired offset is 2 MHz. Oscillator 60 is utilized to provide this 2 MHZ offset by adjusting the output frequency of the oscillator 60 from about 2438.5 MHz to about 2440.5 MHz. The mixer 54 then mixes the RF input signal with the 2440.5

MHz signal from oscillator 60 resulting in an RF signal at the output of mixer 54 having a frequency of about 162 MHz. This 162 MHz RF signal is next supplied to a mixer 56 which mixes the signal with 180 MHz signal supplied to mixer 56 by an oscillator 62. The RF signal occurring at the output of mixer 56 now has a frequency of about 18 MHz and is supplied to the input of a bandpass filter 58 which is the 4 MHz bandwidth IF filter. The analog signal occurring at the output of bandpass filter 58 is depicted in FIG. 5. with filter 58 attenuating the signal in one state resulting in a substantial difference between the amplitude of the signal in the one state than in the other state.

The analog signal occurring at the output of bandpass filter 58 is supplied to the input of an AM (amplitude modulation) detector 66. AM detector 66 then provides at its output line 70 the analog PCM waveform of FIG. 6 which has voltage spikes removed from the analog PCM waveform as is best illustrated by FIG. 6. Since the analog PCM waveform of FIG. 6 has well defined positive and negative voltage levels for its different states, a PCM bit synchronizer connected to the output of AM detector 70 would achieve synchronization with the analog PCM waveform of FIG. 6. Further, because of the well defined positive and negative voltage levels of FIG. 6, a bit synchronizer which receives the analog PCM waveform of FIG. 6 could convert the analog PCM waveform of FIG. 6 to a digital equivalent PCM data stream such as non-return-to-zero (NRZ).

When the RF (radio frequency) input signal has a frequency of about 2278.5 MHz and the telemetry data stream is 9.8 megabits per second with a 10 MHz intermediate frequency filter bandwidth the desired offset is about 5 MHz. Oscillator 60 may then be utilized to provide this offset by adjusting the output frequency of oscillator from about 2438.5 MHz to about 2443.5 MHz. The mixer 54 then mixes the RF input signal with the 2443.5 MHz signal from oscillator 54 resulting in an RF signal at the output of mixer 54 having a frequency of about 165 MHz. This 165 MHz RF signal is next supplied to a mixer 60 which mixes the signal with 180 MHz signal supplied to mixer 60 by an oscillator 62. The RF signal occurring at the output of mixer now has a frequency of about 15 MHz and is supplied to the input of a bandpass filter 58 which is the 10 MHz intermediate frequency bandwidth filter.

For the 9.8 megabits per second PCM/FM telemetry data with a 10 MHz intermediate frequency filter bandwidth, the waveform occurring at the output line 70 of AM detector 66 will be similar to the waveform illustrated in FIG. 6 without voltage spikes and with well defined voltage levels to represents the logic ones and zeros of a PCM data stream.

The offset to the RF signal provided at the output of mixer 54 is approximately one half of the intermediate frequency bandwidth of filter 58.

It should be noted that without the frequency offset of 2MHz supplied by oscillator 60, that is the frequency of the output signal from oscillator 60 is 2338.5 and the use of limiter 64 and FM detector 68, the PCM waveform occurring at FM output line 72 includes the undesirable voltage spikes illustrated in FIG. 2. For the waveform illustrated in FIG. 2, the frequency of the RF signal at the output of mixer 54 is 160 MHz, while the frequency of the RF signal at the output of mixer 56 is 160 MHz.

From the foregoing, it may readily be seen that the present invention comprises a new, unique and exceedingly useful demodulator for correcting the effects of frequency selective fading in PCM/FM telemetry data which constitutes a considerable improvement over the known prior art. Obviously, many modifications and variations of the present invention are possible in light of the above teachings. It is therefore to be understood that within the scope of the present claims the invention may be practiced otherwise than as specifically described.

What is claimed is:

1. A demodulator for minimizing the effects of frequency selective fading in multipath transmission of pulse code modulated/frequency modulated telemetry data, said demodulator comprising:

variable frequency oscillating means for generating a local oscillator signal;

first mixing means for receiving said local oscillator signal and a first radio frequency signal;

said first mixing means combining said first radio frequency signal and said local oscillator signal to generate a second radio frequency signal;

fixed frequency oscillating means for generating a fixed frequency signal;

second mixing means for receiving said fixed frequency signal and said second radio frequency signal, said second mixing means combining said second radio frequency signal and said fixed frequency signal to generate a third radio frequency signal;

each of said first, second and third radio frequency signals being a carrier for said pulse code modulated/frequency modulated telemetry data;

filtering means for receiving said third radio frequency signal and then providing an analog signal, said filtering means attenuating said analog signal in a first state resulting in a detectable difference between the amplitude of said analog signal in said first state and the amplitude of said analog signal in a second state;

said filtering means having an intermediate frequency bandwidth, said local oscillator signal being adjusted to provide a frequency offset to said second radio frequency signal which is about one half of the intermediate frequency bandwidth of said filtering means; and detecting means for receiving said analog signal, said detecting means detecting the amplitude of said analog signal in said first state and the amplitude of said analog signal in said second state to provide an analog pulse code modulated telemetry data signal having voltage spikes removed from said analog pulse code modulated telemetry data signal.

2. The demodulator of claim 1 wherein said detecting means comprises an amplitude modulation detector.

3. The demodulator of claim 1 wherein the intermediate frequency bandwidth of said filtering means is four megahertz, the frequency of said local oscillator signal then being adjusted to provide a two megahertz frequency offset to said second radio frequency signal.

4. The demodulator of claim 1 wherein the intermediate frequency bandwidth of said filtering means is ten megahertz, the frequency of said local oscillator signal then being adjusted to provide a five megahertz frequency offset to said second radio frequency signal.

5. A demodulator for minimizing the effects of frequency selective fading in multipath transmission of pulse code modulated/frequency modulated telemetry data, said demodulator comprising:

a variable frequency oscillator for generating a local oscillator signal;

a first mixer connected to said variable frequency oscillator to receive said local oscillator signal, said first mixer receiving a first radio frequency signal;

said first mixer combining said first radio frequency signal and said local oscillator signal to generate a second radio frequency signal;

a fixed frequency oscillator for generating a fixed frequency signal;

a second mixer connected to said fixed frequency oscillator to receive said fixed frequency signal and said first mixer to receive said second radio frequency signal, said second mixer combining said fixed frequency signal and said second radio frequency signal to generate a third radio frequency signal;

each of said first, second and third radio frequency signals being a carrier for said pulse code modulated/frequency modulated telemetry data;

a bandpass filter connected to said second mixer to receive said third radio frequency signal and then provide an analog signal, said bandpass filter attenuating said analog signal in a first state resulting in a detectable difference between the amplitude of said analog signal in said first state and the amplitude of said analog signal in a second state;

said bandpass filter having an intermediate frequency bandwidth, said local oscillator signal being adjusted to provide a frequency offset to said second radio frequency signal which is about one half of the intermediate frequency bandwidth of said bandpass filter; and an amplitude modulation detector connected to said bandpass filter to receive said analog signal, said amplitude modulation detector detecting the amplitude of said analog signal in said first state and the amplitude of said analog signal in said second state to provide an analog pulse code modulated telemetry data signal having voltage spikes removed from said analog pulse code modulated telemetry data signal.

6. The demodulator of claim 5 wherein the frequency of said first radio frequency signal is about 2278.5 megahertz.

7. The demodulator of claim 5 wherein the frequency of said fixed frequency signal is about 180 megahertz.

8. The demodulator of claim 5 wherein the intermediate frequency bandwidth of said bandpass filter is four megahertz, the frequency of said local oscillator signal then being adjusted to provide a two megahertz frequency offset to said second radio frequency signal.

9. The demodulator of claim 8 wherein the frequency of said local oscillator signal after being adjusted to provide said two megahertz frequency offset is about 2440.5 Megahertz.

10. The demodulator of claim 8 wherein the frequency of said second radio frequency signal is about 162 Megahertz.

11. The demodulator of claim 8 wherein the frequency of said third radio frequency signal is about eighteen Megahertz.

12. The demodulator of claim 5 wherein the intermediate frequency bandwidth of said bandpass filter is ten megahertz, the frequency of said local oscillator signal then being adjusted to provide a five megahertz frequency offset to said second radio frequency signal.

13. The demodulator of claim 12 wherein the frequency of said local oscillator signal after being adjusted to provide said five megahertz frequency offset is about 2443.5 Megahertz.

14. The demodulator of claim 12 wherein the frequency of said second radio frequency signal is about 165 megahertz.

15. The demodulator of claim 12 wherein the frequency of said third radio frequency signal is about fifteen megahertz.

16. A method for minimizing the effects of frequency selective fading in multipath transmission of pulse code modulated/frequency modulated telemetry data, comprising the steps of:

at a receiving location, receiving a first radio frequency signal;

generating a local oscillator signal, said local oscillator signal having a frequency which is adjustable;

subtracting said first radio frequency signal from said local oscillator signal to provide a second radio frequency signal;

generating a fixed frequency signal;

subtracting said second radio frequency signal from said fixed frequency signal to provide a third radio frequency signal, each of said first, second and third radio frequency signals being a carrier for said pulse code modulated/frequency modulated telemetry data;

filtering said third radio signal in a bandpass filter having an intermediate frequency bandwidth to provide an analog signal;

attenuating said analog signal in a first state resulting in a detectable difference between the amplitude of said analog signal in said first state and the amplitude of said analog signal in a second state;

adjusting said local oscillator signal to provide a frequency offset to said second radio frequency signal which is about one half of the intermediate frequency bandwidth of said bandpass filter; and then detecting the amplitude of said analog signal in said first state and the amplitude of said analog signal in said second state to form an analog pulse code modulated telemetry data signal having voltage spikes removed from said analog pulse code modulated telemetry data signal.

\* \* \* \* \*